United States Patent [19]

Villa

[11] Patent Number: 5,602,417
[45] Date of Patent: Feb. 11, 1997

[54] LOW-NOISE BIPOLAR TRANSISTOR OPERATING PREDOMINANTLY IN THE BULK REGION

[75] Inventor: Flavio Villa, Milan, Italy

[73] Assignee: SGS-Thomson Microelectronics S.r.l., Agrate Brianza, Italy

[21] Appl. No.: 312,386

[22] Filed: Sep. 26, 1994

[30] Foreign Application Priority Data

Sep. 27, 1993 [EP] European Pat. Off. ............. 93830393
Jul. 21, 1994 [EP] European Pat. Off. ............. 94830370

[51] Int. Cl.$^6$ ...................... H01L 27/082; H01L 27/102
[52] U.S. Cl. ............................. 257/593; 257/592
[58] Field of Search ...................... 257/593, 592

[56] References Cited

U.S. PATENT DOCUMENTS

| 4,047,217 | 9/1977 | McCaffrey et al. | 357/34 |
| 4,873,199 | 10/1989 | Hunt | 257/592 |
| 4,881,111 | 11/1989 | Sanders | 357/34 |

FOREIGN PATENT DOCUMENTS

| 0029548 | 6/1981 | European Pat. Off. | 257/593 |
| 0096155 | 12/1983 | European Pat. Off. | 257/593 |
| 0139130 | 5/1985 | European Pat. Off. | 257/593 |
| 0316951 | 5/1989 | European Pat. Off. | 257/593 |
| 0435331 | 7/1991 | European Pat. Off. | 257/593 |
| 0553589 | 8/1993 | European Pat. Off. | 257/593 |
| 2634618 | 2/1978 | Germany | 257/593 |

OTHER PUBLICATIONS

Chen et al., "An Advanced Bipolar Transistor with Self–Aligned Ion–Implanted Base and W/Poly Emitter," *IEEE Transactions on Electron Devices* 35(8): 1322–1327, 1988.

*Primary Examiner*—Steven H. Loke
*Attorney, Agent, or Firm*—Seed and Berry LLP; David V. Carlson

[57] ABSTRACT

A low-noise NPN transistor comprising a cut-off region laterally surrounding, at a given distance, the emitter region in the surface portion of the transistor and of such conductivity as to practically turn off the surface portion of the transistor, so that the transistor operates mainly in the bulk portion. The cut-off region is formed by a P ring astride a P$^-$ type well region and the epitaxial layer.

12 Claims, 3 Drawing Sheets

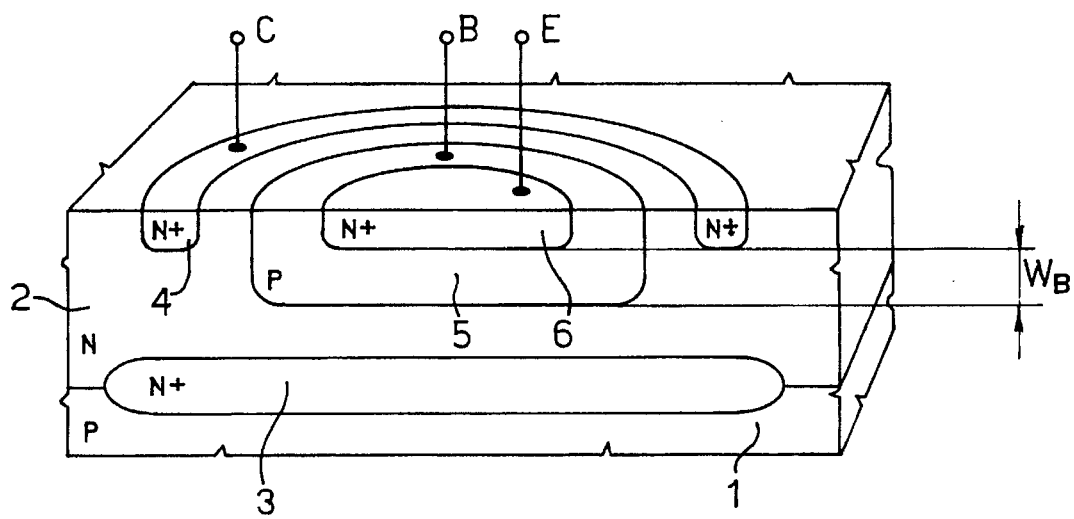
Fig.1 (Prior Art)
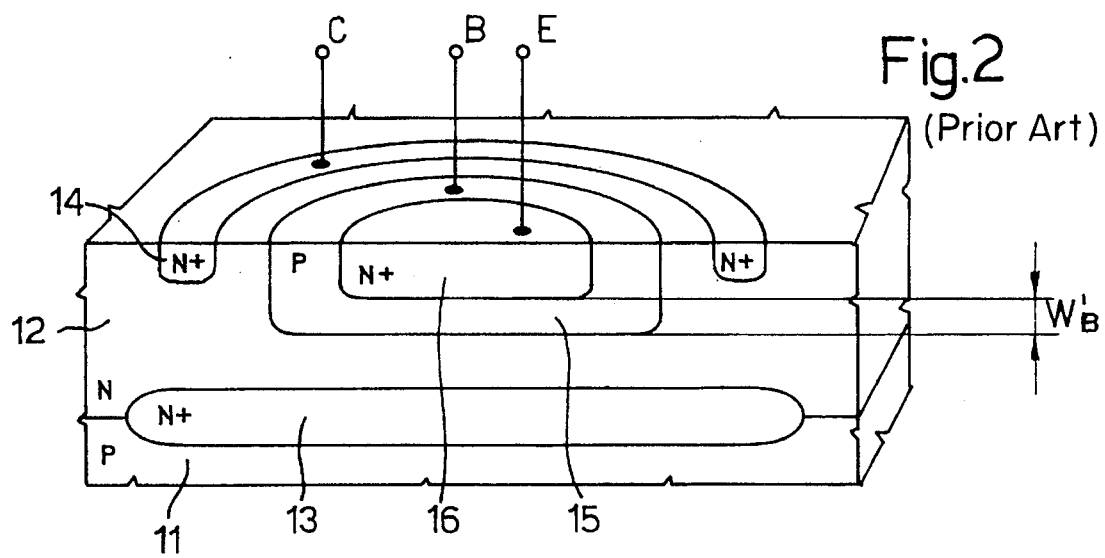
Fig.2 (Prior Art)
| $R_{S1}$ (ΩCM) | $W_1$ (μM) | $R_{S2}$ (ΩCM) | $W_2$ (μM) | $BV_{PT}$ (V) |
|---|---|---|---|---|
| 2 | 6 | 2 | 5 | 23 |
| 2 | 6 | 4 | 5 | 39 |
| 2 | 6 | 6 | 5 | 45 |
| 2 | 5 | 6 | 6 | 53 |
Fig.8

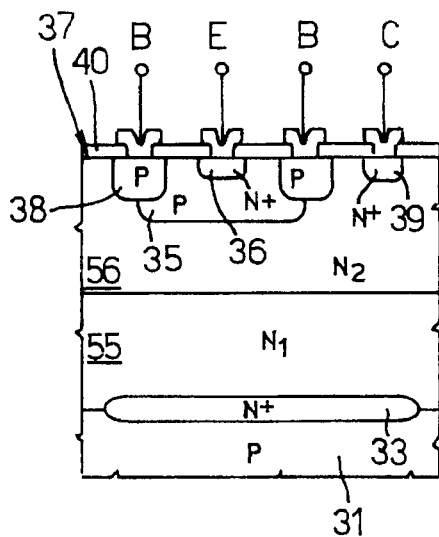
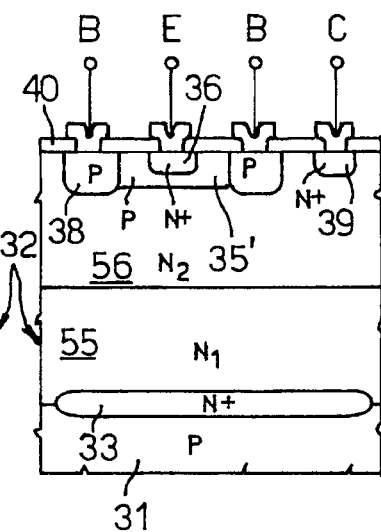
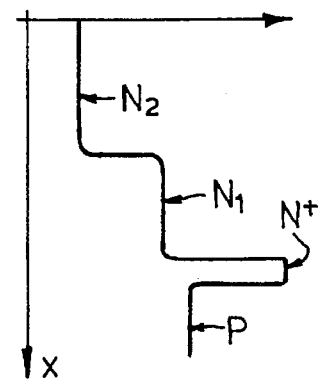
Fig.6a        Fig.6b        Fig.6c
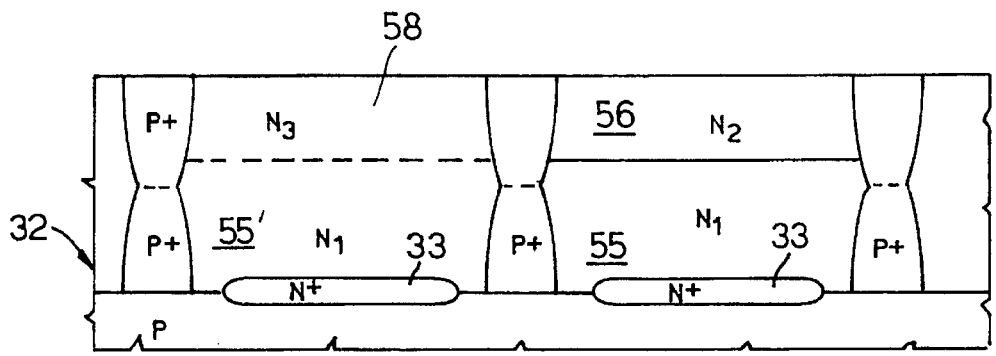
Fig.7a
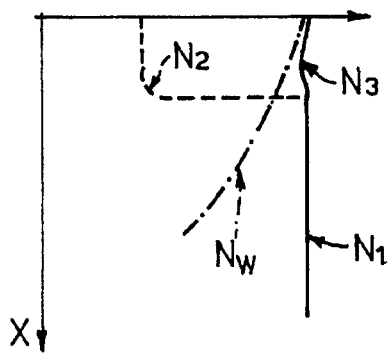
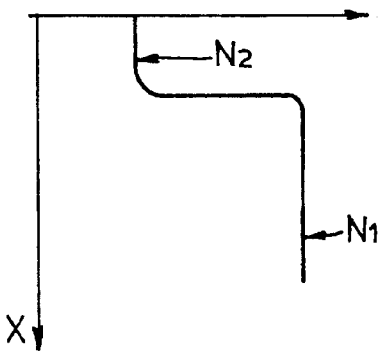
Fig.7b        Fig.7c

LOW-NOISE BIPOLAR TRANSISTOR OPERATING PREDOMINANTLY IN THE BULK REGION

CROSS-REFERENCE TO RELATED APPLICATIONS

The present application claims priority from European Patent Application No. 94830370.6, filed Jul. 21, 1994. The present application is related to pending U.S. Patent Application entitled "LOW-NOISE BIPOLAR TRANSISTOR", by Flavio Villa, filed Sep. 26, 1994 and assigned Ser. No. 08/312,472 (Seed and Berry Docket No. 854063.412), which claims priority from European Patent Application No. 93830393.0 filed Sep. 27, 1993.

FIELD OF THE INVENTION

The present invention relates to a low-noise bipolar transistor, and more particularly to a low-noise bipolar transistor operating predominantly in the bulk region.

BACKGROUND OF THE INVENTION

As is known, in electronic devices, the term "noise" indicates a random fluctuation in currents or voltages at the device terminals, and may seriously limit the minimum signal level that can be handled by the device.

The noise in each device is due to various physical causes, some of which have been known for some time. Of particular interest are what are known as "flicker" noise (also indicated 1/f) and "burst" noise, the first of which exists in all and the second in a significant percentage of devices.

Flicker noise is commonly acknowledged to be caused by fluctuations in the number of carriers, due to entrapment of the carriers in surface layers of the device, i.e., to tunneling at the semiconductor-oxide interface. According to accepted theory, the carriers in the semiconductor may communicate with trap levels at a given distance within the tunnel oxide layer, and remain trapped for some time prior to being re-emitted. In the case of transistors, in particular, flicker noise sources are located at the base-emitter junction.

Flicker noise is especially undesirable in the case of operational amplifier input transistors and audio preamplifiers.

Burst noise, on the other hand, is caused by a sharp variation in current between two or more constant values. Variation frequency may be very low (less than 1 Hz) or high (hundreds of Hz), in which case, burst noise may be confused with a high degree of flicker noise. This type of noise is generally attributed to the presence of defects, metal inclusions and precipitates in the space charge region of the junction; and the fluctuation in current depends on the extent, if any, to which the defect participates in conduction. The fact that burst noise is reduced by deficiency-reducing processes, such as gettering, would appear to bear out this theory.

In the case of flicker noise, the noise power at the output terminals of a transistor is proportional to $I_B^\alpha$, where $I_B$ is the base current and $\alpha$ a constant ranging between 1 and 2. In the case of burst noise, the output noise power is inversely proportional to the square of the gain of the transistor, so that, for a given collector current, high-gain transistors are less affected by flicker and burst noise as compared with low-gain types.

One technique for reducing flicker and burst noise is to produce extremely high-gain (super-beta SBT) transistors with a gain typically ranging between 1000 and 10,000 for collector currents below 1 µA. In NPN type super-beta transistors, the base layer is narrower as compared with standard transistors, for improving the base transfer factor (reducing recombination of the charge carriers) and so increasing gain. In a planar process, in particular, by reducing the base width (thickness of the P type base layer between the $N^+$ type emitter region and the N type epitaxial layer) to roughly 0.2–0.3 µm (as compared with the normal 0.8 µm), current gain increases to as much as 2000–5000 (as compared with 200–300).

High-gain NPN transistors may be produced simultaneously with conventional NPN types by adding a photolithography and diffusion step to the planar process. In practice, following base diffusion of the conventional NPN transistor, windows are opened photolithographically, through which the emitter of the high-$\beta_F$ transistors is predeposited and partially diffused. This is followed by photolithography and diffusion of the conventional emitter, so that the emitter of high-$\beta_F$ transistors is deeper than that of conventional ones, thus considerably reducing the thickness of the active base (by way of comparison, refer to FIGS. 1 and 2 relative to a standard and a high-gain transistor, in which $w_B$ and $w_{B'}$ indicate the respective base widths).

High-gain transistors of the aforementioned type, however, present an extremely low (roughly 3 V) open-base collector-emitter breakdown voltage ($BV_{CEO}$), and cannot be employed in applications requiring a higher voltage, due to the risk of punch-through between the emitter and collector.

Moreover, prediffusion increases the likelihood of emitter pipes being formed, due to penetration of an emitter portion inside the base region as far as the collector, as a result of crystallographic defects. As is known, such pipes so modify the $I_C$-$V_{CE}$ output characteristics of the transistor that they become resistive. This problem is particularly felt in the case of power integrated circuits, even to the extent of eliminating the advantages of high gain, or resulting in production rejects and, hence, reduced efficiency.

A further drawback lies in the need for providing an additional masking step as compared with the standard fabrication process, thus increasing fabrication costs.

Another known noise reducing solution consists in producing transistors with a high $A_E/P_E$ ratio, i.e., a high ratio of the area and perimeter of the emitter region visible from above, so as to reduce the contribution of the surface portions with respect to that of the deep regions (bulk). This solution, however, only provides for reducing flicker and is ineffective as regards burst noise.

SUMMARY OF THE INVENTION

It is an object of the present invention to provide a transistor designed to overcome the drawbacks posed by known solutions, and which, in particular, provides for reducing the noise of transistors by means of a flexible solution, adaptable to various requirements, and ensuring high breakdown voltages.

According to the present invention, there is provided a low-noise bipolar transistor as described in more detail below.

In practice, the invention consists in reducing the doping concentration of the base region using a much less heavily doped P-well layer as compared with the normal P base layer, thus greatly increasing gain and drastically reducing 1/f and burst noise.

To prevent the formation of surface space charge regions, an annular P type region is formed at the P-well/N$^+$ junction, astride the well region and the epitaxial layer.

BRIEF DESCRIPTION OF THE DRAWINGS

FIG. 1 shows a cross section in perspective of a silicon wafer forming a known NPN transistor.

FIG. 2 shows a cross section in perspective of a silicon wafer forming a high-gain NPN transistor.

FIGS. 6A, 6B and 6C respectively show a third and fourth embodiment and the respective doping atom concentration profile.

FIG. 7A shows a cross section of a silicon wafer prior to implementing the transistor according to the present invention.

FIGS. 7B and 7C show two concentration profiles of different portions of the FIG. 7A section.

FIG. 8 shows a table of test results obtained by the Applicant.

DETAILED DESCRIPTION OF THE INVENTION

Figure 3:
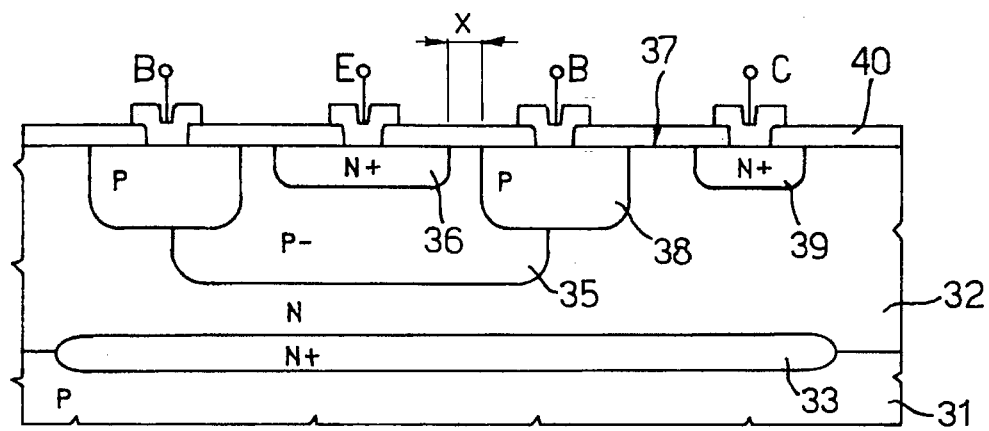
FIG. 3 shows a cross section of a silicon wafer forming a first embodiment of an NPN transistor in accordance with the present invention.

FIG. 1 shows a standard NPN transistor with a P type substrate 1; an N type epitaxial layer 2; an N$^+$ type buried layer 3; an N$^+$ type enriched collector region 4; a P type base region 5; and an N$^+$ type emitter region 6. $W_B$ indicates the width of base region 5.

FIG. 2 shows a known high-gain NPN transistor with a substrate 11; an epitaxial layer 12; a buried layer 13; an enriched collector region 14; a base region 15; and an emitter region 16. As can be seen, emitter region 16 is deeper than the corresponding region 6 in FIG. 1, so that base width $w_B$ of base region 15 is less than the corresponding base width $w_B$ in FIG. 1.

FIG. 3 shows an NPN transistor in accordance with the teachings of the present invention. More specifically, the transistor is formed in a silicon wafer comprising a P type substrate 31; an N type epitaxial layer 32; and an N$^+$ type buried layer 33 interposed between substrate 31 and epitaxial layer 32 at the active area of the transistor. Inside epitaxial layer 32, there are formed a P type well region 35 less heavily doped as compared with the others and therefore indicated P$^-$; an N$^+$ type emitter region 36 formed inside well region 35 and facing surface 37 of the wafer; a P type annular region 38 formed astride well region 35 and epitaxial layer 32, facing surface 37, and laterally surrounding, at a distance, emitter region 36; and an N$^+$ type enriched region 39 at the collector contact.

FIG. 3 also shows schematically the emitter, base and collector contacts E, B and C, and a protective oxide layer 40.

To prevent stressing the semiconductor material, the FIG. 3 transistor comprises no deep collector regions (normally N$^+$ type and provided between contact 39 and buried layer 33).

Figure 4:
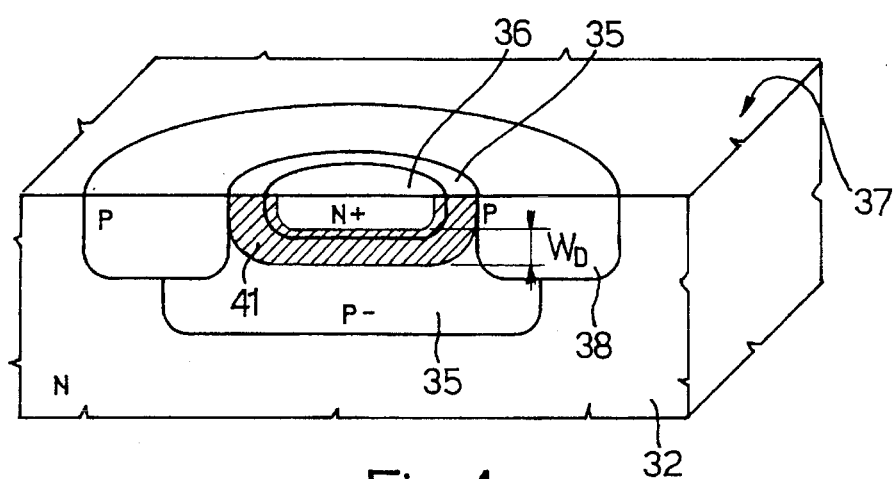
FIG. 4 shows a view in perspective of the FIG. 3 transistor.

In the embodiment shown, the distance X between emitter region 36 and annular region 38 is so selected that the width of the depletion region formed in well region 35, close to surface 37, equals the in-bulk depth of the depletion region, as shown in FIG. 4 wherein the hatched portion indicates depletion region 41, and the in-bulk depth of the depletion region is indicated $w_D$. As can be seen, in the example shown, distance X equals the width of the depletion region close to surface 37.

In the FIG. 3 transistor, annular region 38 (which, together with well region 35, forms the base region) presents substantially the same doping level as base region 5 of standard transistors (semiconductor layer sheet resistance $R_s$ of about a hundred $\Omega/\square$) so that the peripheral portion of the base region presents the same characteristics as the standard base region 5. Conversely, well region 35 presents a much lower doping level as compared with annular region 38 (semiconductor layer sheet resistance $R_s$ of a few K$\Omega/\square$), and is much deeper than the standard base region 5 (typical depths from surface 37 for emitter region 36, annular region 38 and well region 35 are 1.5 μm, 1.8 μm and 3 μm respectively). Thus, annular region 38 is deeper than emitter region 36 and roughly half the depth of well region 35. As a result, the central portion of the emitter region sees a less heavily doped and deeper portion as compared with the structure of known transistors.

Well region 35 is formed prior to the base diffusion step (in this case, resulting in annular region 38) which is performed by predeposition and subsequent diffusion of boron atoms.

By virtue of annular region 38 about emitter region 36, and the less heavily doped portion 35 facing emitter region 36, operation of the peripheral surface region of the transistor is reduced, and the transistor operates mainly in the bulk portion, which is deeper as compared with the known structure. As a result, in the effectively operative base region, recombination is reduced and gain increased (to 1000–1500), thus reducing both flicker and burst noise.

The spacing of annular region 38 and emitter region 36 provides for minimizing base current $I_B$ and ensuring a high gain $\beta_{max}$ over the entire base-emitter junction, thus minimizing both equivalent input noise current ($i_n$ proportional to the square root of the base current) and equivalent noise voltage ($e_n$).

The FIG. 3 structure may be used in any precision circuit requiring high gain (e.g. current mirror and band-gap circuits), but in which given breakdown voltage $BV_{CEO}$ values must be ensured.

In general, the FIG. 3 structure requires an additional mask for forming well region 35. In most power circuits, however, a P-well layer is already provided at some point, so that such a mask is already included in most fabrication processes. If such is the case, the FIG. 3 structure simply involves modifying the existing mask, with no need for additional fabrication steps, and hence no increase in cost, as compared with traditional processes. Even if the rest of the circuit integrated in the same chip presents no P-well regions, however, the disadvantage of providing an additional mask is more than compensated for by the considerable improvement in obtained performance.

Figure 5:
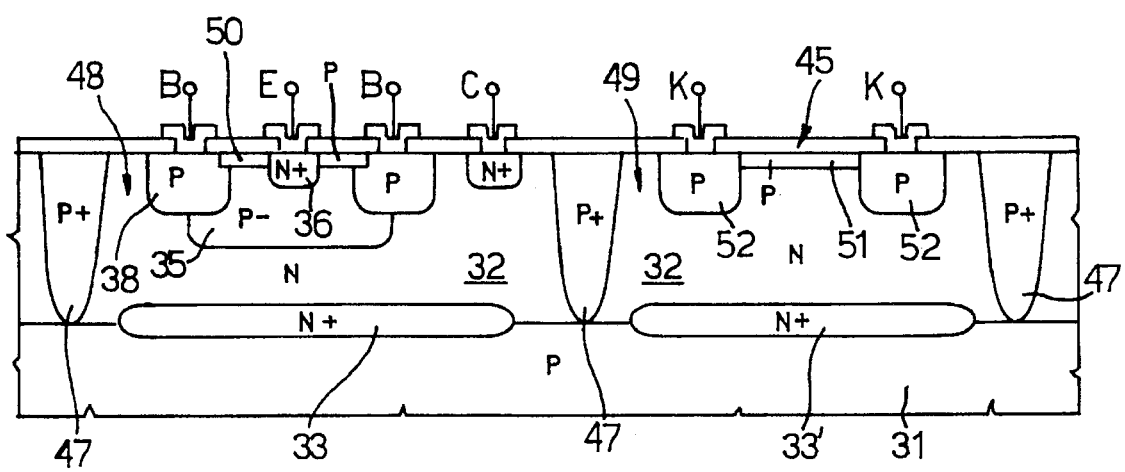
FIG. 5 shows a cross section of a silicon wafer forming a second embodiment of the present invention.

As shown in FIG. 5, epitaxial layer 32 is divided into a number of wells by P$^+$ type deep insulating regions 47 which separate region 48 integrating the bipolar transistor according to the invention from region 49 integrating resistor 45; and buried layers 33, 33' are provided respectively between substrate 31 and regions 48 and 49 of the epitaxial layer. In addition to regions 35, 36 and 38 identical to those in FIG. 3, the bipolar transistor also comprises an implanted P type layer 50 completely surrounding emitter region 36 at the surface and therefore annular in shape (viewed from above), and which preferably presents a doping level midway between that of well region 35 and annular region 38 (typically of about 1 KΩ/□). The predetermined distance between emitter region 36 and annular region 38 is greater than the bulk depletion depth in the base well portion region 35 about the emitter region 36. Thus, the laterally spaced distance is selected to approximate a width of the near surface depletion region.

Resistor 45 is formed by an implanted P type layer 51 extending between contact regions 52 connected to respective contacts K; and, being formed simultaneously using known resistor fabrication techniques, implanted layers 50 and 51 present the same characteristics.

FIGS. 6A and 6B show two embodiments that are characterized by a high degree of flexibility, high breakdown voltage, high gain, a low noise level and high cut-off frequency, due to the presence of an epitaxial layer with a variable doping profile. A difference between the two embodiments of FIGS. 6A lies in the depth of the well region.

More specifically, the FIG. 6A and 6B structures present an epitaxial layer in two portions: a bottom portion 55 over substrate 31; and a top portion 56 extending as far as surface 37 of the wafer. Bottom portion 55 presents a doping level $N_1$, and a top portion 56 a doping level $N_2$, where $N_1 > N_2$ as shown in FIG. 6C; and regions 35, 35', 38 and 39 are all embedded in the less heavily doped top portion 56 of the epitaxial layer.

In the FIG. 6A structure, the less heavily doped top portion 56 of the epitaxial layer reduces depletion of well region 35, so that the base-collector junction provides for better voltage holding (higher punch-through voltage between the emitter and collector) as shown in the FIG. 8 table which shows the test results obtained by the Applicant with an epitaxial layer 32 of a total thickness of 11 μm. In the FIG. 8 table, $R_{s1}$ and $w_1$ respectively indicate the resistivity and thickness of bottom portion 55 of the epitaxial layer ($N_1$ doping level); $R_{s2}$ and $w_2$ the resistivity and thickness of top portion 56 ($N_2$ doping level); and $BV_{PT}$ the punch-through voltage. The top row in the table corresponds to the FIG. 3 embodiment wherein $R_{s1}$ and $R_{s2}$ are the same.

In the FIG. 6B structure, appropriate selection of the doping level of top portion 56 of the epitaxial layer provides for obtaining the same improvement in punch-through voltage alongside a simultaneous improvement in one of the performance features of the transistor. A shallower well region 35' as compared with the FIG. 6A structure, in fact, provides for improving performance in terms of gain, cutoff frequency and the noise level of the transistor.

The FIG. 6A and 6B structures can be formed quite easily, with no additional cost, using currently marketed single-wafer epitaxial reactors which, as is known, provide for obtaining a single epitaxial layer with a variable concentration profile for achieving the required precision.

Any problems posed by surface inversion of top portion 56 of epitaxial layer 32 in the FIG. 6A, 6B structures may be solved using a threshold correcting mask normally provided in current bipolar and BCD (Bipolar-CMOS-DMOS) processes, and which allows phosphorous ions to be implanted in the active areas requiring threshold correction prior to forming the components of the integrated circuit.

In the event other integrated circuit components require an epitaxial layer with constant doping profile (roughly equal to $N_1$), the embodiments of FIG. 6A, 6B may be modified by adjusting the doping level of the top part of the epitaxial layer by implanting an N type well as shown in FIG. 7A.

More specifically, FIG. 7A shows a cross section of a silicon wafer prior to forming the regions forming the various components of the integrated circuit. The right-hand portion of the FIG. 7A section is for integrating a low-noise NPN bipolar transistor as shown in FIG. 6A or 6B, and therefore presents an epitaxial layer divided into a bottom portion 55 with an $N_1$ doping level, and a top portion 56 with an $N_2$ doping level lower than $N_1$, as shown in the FIG. 7C diagram. Conversely, the left-hand portion of FIG. 7A is for housing an electric component requiring an epitaxial layer with a substantially uniform doping profile, and therefore comprises a bottom portion 55' with an $N_1$ doping level, and a top portion 58 with an $N_3 \approx N_1$ doping level. As shown in FIG. 7B, relative to the doping profile of the epitaxial layer in the left-hand portion of FIG. 7A, the doping level equals the sum of the original $N_2$ profile and the $N_W$ profile resulting from implantation of the N-well. As such, the total profile ($N_1$ and $N_3$ together) is roughly constant.

Clearly, changes may be made to the transistor and relative fabrication process as described and illustrated herein without, however, departing from the scope of the present invention.

I claim:

1. A low noise bipolar transistor formed in a layer of semiconductor material having a surface portion and a deeper bulk portion, the transistor comprising:

an N+ emitter region;

a P– base well portion surrounding said N+ emitter region;

an N+ collector region; and a P annular region located adjacent the surface portion and laterally surrounding, at a lateral distance at least equal to the bulk depletion depth in said base well portion, about the emitter region; wherein, said N+ emitter region is in the surface portion, and a portion of said P-base well portion is located between the annular region and the N+ emitter region such that the transistor operates predominantly in the bulk portion when in a conducting state.

2. A transistor as claimed in claim 1 wherein said base well portion presents a semiconductor layer sheet resistivity of a few KΩ/□; and said annular region presents a semiconductor layer sheet resistivity of about a hundred Ω/□.

3. A transistor as claimed in claim 1 wherein said base well portion is formed by a P-well region; and said annular region is formed by a base diffusion.

4. A transistor as claimed in claim 1 wherein said annular region is deeper than said emitter region and roughly half the depth of said base well portion.

5. A transistor as claimed in claim 1 wherein said layer of semiconductor material comprises an epitaxial layer with a top portion having a first doping level and a bottom portion having a second doping level higher than the first doping level.

6. A transistor as claimed in claim 5 wherein said top portion extends from the surface of said transistor and embeds said emitter region, said annular region and said base well portion.

7. A transistor as claimed in claim 6 wherein said base well portion is shallower than said annular region.

8. A low noise bipolar transistor formed in a layer of semiconductor material having a surface portion and a deeper bulk portion, the transistor comprising:

an N+ emitter region;

a P− base well portion surrounding said N+ emitter region;

an N+ collector region;

a P annular region located adjacent the surface portion and laterally surrounding, at a lateral distance greater than the bulk depletion depth in said base well portion, about the emitter region said N+ emitter region is in the surface portion, and a portion of said P− base well portion is located between the annular region and the N+ emitter region such that the transistor operates predominantly in the bulk portion when in a conducting state, and an implanted region extending between said emitter region and said annular region close to the surface of the layer of semiconductor material, said implanted region having a doping level between a doping level of said P− base well portion and a doping level of said P annular region.

9. A transistor formed within a wafer having a substrate and an epitaxial layer, the epitaxial layer extending from the substrate to a top surface of the wafer, the transistor comprising:

a P− control region formed within the epitaxial layer wherein the control region comprises a well region that extends downward from the top surface of the wafer;

an N+ first path region formed within the well region, the first path region extending downwards into the well region from the top surface of the wafer;

a P encompassing region that surrounds at a laterally-spaced distance, the first path region, the laterally spaced distance being selected such that the transistor operates predominantly downward from the top surface of the wafer when the transistor is in a conductive state; and an N+ second path region formed within the epitaxial layer, the second path region being electrically coupled to the first path region when the transistor is in the conductive state, and wherein a near-surface depletion region and an in-bulk depletion region are formed within the transistor when the transistor is in the conductive state, the laterally-spaced distance defining a width between the N+ first path region and the P encompassing region and being at least equal to a width of the near-surface depletion region.

10. The transistor of claim 9 wherein a depletion region is formed within the well region when the transistor is in the conductive state, the depletion region comprising the near-surface depletion region and the in-bulk depletion region, the width of the near-surface depletion region being at least equal to a depth of the in-bulk depletion region.

11. The transistor of claim 9 wherein the encompassing region and the first path region extend downward into the epitaxial layer from the surface of the wafer and wherein the encompassing region extends to a position in the epitaxial layer that is deeper than a relative position to which the first path region extends.

12. The transistor of claim 9 wherein the well region is less-heavily doped than the encompassing region.

* * * * *